US012593612B2

(12) United States Patent
Zhou

(10) Patent No.: US 12,593,612 B2
(45) Date of Patent: Mar. 31, 2026

(54) STRUCTURE OF SEMICONDUCTOR DEVICE AND METHOD FOR FABRICATING THE SAME

(71) Applicant: United Microelectronics Corp., Hsinchu (TW)

(72) Inventor: Zhi-Biao Zhou, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 128 days.

(21) Appl. No.: 17/156,967

(22) Filed: Jan. 25, 2021

(65) Prior Publication Data

US 2022/0208852 A1     Jun. 30, 2022

(30) Foreign Application Priority Data

Dec. 24, 2020     (CN) .......................... 202011545152.1

(51) Int. Cl.
H01L 27/20 (2006.01)
H01L 23/34 (2006.01)
(Continued)

(52) U.S. Cl.
CPC ............. H10N 39/00 (2023.02); H01L 23/34 (2013.01); H01L 23/367 (2013.01);
(Continued)

(58) Field of Classification Search
CPC ....... H10N 39/00; H01L 23/34; H01L 23/367; H01L 23/552; H01L 21/8258;
(Continued)

(56) References Cited

U.S. PATENT DOCUMENTS

| | | | | | |
|---|---|---|---|---|---|
| 4,993,000 | A | * | 2/1991 | Niitsuma | ............. H03H 9/1085 |
| | | | | | 333/194 |
| 6,927,649 | B2 | * | 8/2005 | Metzger | ............... H03H 9/0557 |
| | | | | | 333/133 |

(Continued)

FOREIGN PATENT DOCUMENTS

| | | |
|---|---|---|
| CN | 102986046 | 3/2013 |
| CN | 105280620 | 1/2016 |

(Continued)

OTHER PUBLICATIONS

"Office Action of China Counterpart Application", issued on Feb. 27, 2025, p. 1-p. 9.

(Continued)

*Primary Examiner* — Jay C Kim
(74) *Attorney, Agent, or Firm* — J.C. PATENTS

(57) ABSTRACT

A structure of a semiconductor device is provided, including a circuit substrate. A first metal bulk layer is disposed on the circuit substrate. A buffer layer is disposed on the first metal bulk layer. An absorbing layer is disposed on the buffer layer. A first electrode layer is disposed on the absorbing layer. A plurality of piezoelectric material units are disposed on the first electrode layer. A protection layer is conformally disposed on the piezoelectric material units. A second metal bulk layer is disposed over the piezoelectric material units, and including a first part and a second part. The first part penetrating through the protection layer is disposed on the piezoelectric material units, serving as a second electrode layer. The second part is at a same level of the first part, and at least electrically connecting to the first electrode layer.

16 Claims, 8 Drawing Sheets

(51) Int. Cl.

| | |
|---|---|
| *H01L 23/367* | (2006.01) |
| *H01L 23/552* | (2006.01) |
| *H03H 3/02* | (2006.01) |
| *H03H 9/17* | (2006.01) |
| *H03H 9/54* | (2006.01) |
| *H03H 9/56* | (2006.01) |
| *H10D 30/47* | (2025.01) |
| *H10D 30/60* | (2025.01) |
| *H10D 62/83* | (2025.01) |
| *H10D 62/85* | (2025.01) |
| *H10D 84/08* | (2025.01) |
| *H10N 39/00* | (2023.01) |

(52) U.S. Cl.
CPC ............. *H01L 23/552* (2013.01); *H03H 3/02* (2013.01); *H03H 9/173* (2013.01); *H03H 9/545* (2013.01); *H03H 9/564* (2013.01); *H10D 30/475* (2025.01); *H10D 30/60* (2025.01); *H10D 62/83* (2025.01); *H10D 62/8503* (2025.01); *H10D 84/08* (2025.01); *H03H 2003/021* (2013.01)

(58) Field of Classification Search
CPC . H01L 29/16; H01L 29/2003; H01L 29/7786; H01L 29/78; H03H 3/02; H03H 9/173; H03H 9/545; H03H 9/564; H03H 2003/021; H03H 9/0561; H03H 9/02; H03H 9/64; H10D 30/475; H10D 30/60; H10D 62/83; H10D 62/8503; H10D 84/08; H10D 84/40; H10D 84/82; H10D 88/101
See application file for complete search history.

(56) References Cited

U.S. PATENT DOCUMENTS

| | | | | |
|---|---|---|---|---|
| 6,963,257 | B2 | 11/2005 | Ella et al. | |
| 7,248,131 | B2 * | 7/2007 | Fazzio ................. | H03H 9/0557 |
| | | | | 29/25.35 |
| 7,863,699 | B2 * | 1/2011 | Dropmann .............. | H01L 25/16 |
| | | | | 333/191 |
| 7,943,412 | B2 * | 5/2011 | Buchwalter .......... | H03H 9/2405 |
| | | | | 257/E33.059 |
| 8,367,451 | B2 * | 2/2013 | Qiu ..................... | B81C 1/00095 |
| | | | | 438/619 |
| 8,587,183 | B2 * | 11/2013 | Chen ..................... | H02N 1/006 |
| | | | | 310/346 |
| 8,748,287 | B2 | 6/2014 | Barth et al. | |
| 8,912,844 | B2 | 12/2014 | Li et al. | |
| 8,921,201 | B2 | 12/2014 | Luce et al. | |
| 9,048,285 | B2 | 6/2015 | Chen et al. | |
| 9,058,455 | B2 * | 6/2015 | Adkisson .............. | H01L 23/481 |
| 9,546,090 | B1 * | 1/2017 | Xia ..................... | B81C 1/00253 |
| 9,608,594 | B2 * | 3/2017 | Burak ................ | H03H 9/02157 |
| 9,634,641 | B2 * | 4/2017 | Nishimura ........... | H03H 9/0576 |
| 9,640,531 | B1 * | 5/2017 | Or-Bach ............. | H01L 27/1203 |
| 9,650,241 | B2 * | 5/2017 | Zhang ..................... | B81B 7/02 |
| 9,691,963 | B2 * | 6/2017 | Burak ................... | H03H 9/173 |
| 9,705,173 | B2 | 7/2017 | Li et al. | |
| 9,786,613 | B2 | 10/2017 | Stuber | |

| | | | | |
|---|---|---|---|---|
| 9,893,270 | B2 * | 2/2018 | Araki ...................... | H03H 3/02 |
| 10,062,943 | B2 | 8/2018 | Li | |
| 10,109,474 | B1 | 10/2018 | Wang et al. | |
| 10,189,705 | B1 * | 1/2019 | Campanella Pineda ..................... | |
| | | | | B81C 1/00246 |
| 10,263,587 | B2 * | 4/2019 | Patil ................... | H03H 9/02118 |
| 10,361,676 | B2 | 7/2019 | Yusuf | |
| 10,367,470 | B2 * | 7/2019 | Wasilik .............. | H03H 9/1014 |
| 10,389,331 | B2 * | 8/2019 | Hurwitz ............. | H03H 9/0523 |
| 10,396,759 | B2 * | 8/2019 | Irieda ................... | H03H 9/564 |
| 10,411,067 | B2 * | 9/2019 | Then ................... | H03H 9/0542 |
| 10,468,454 | B1 * | 11/2019 | Campanella-Pineda ..................... | |
| | | | | H01L 21/56 |
| 10,511,286 | B2 * | 12/2019 | Baek ..................... | H03H 9/542 |
| 10,541,668 | B2 * | 1/2020 | Shin ........................ | H03H 3/02 |
| 10,547,286 | B2 * | 1/2020 | Sung ................... | H03H 9/1014 |
| 10,547,287 | B2 * | 1/2020 | Kim ...................... | H03H 9/54 |
| 10,630,259 | B2 * | 4/2020 | Hurwitz .............. | H03H 9/1014 |
| 10,636,776 | B2 * | 4/2020 | Rahim ................... | H03H 3/02 |
| 10,686,422 | B2 * | 6/2020 | Huang ................. | H03H 9/171 |
| 10,696,047 | B2 * | 6/2020 | Bibl ..................... | B41J 2/14233 |
| 10,829,364 | B2 * | 11/2020 | Cheng ................. | B81B 3/0021 |
| 10,855,250 | B2 * | 12/2020 | Gibb ................... | H03H 9/0523 |
| 10,903,817 | B2 * | 1/2021 | Yoon ..................... | H03H 9/173 |
| 10,988,376 | B2 * | 4/2021 | Qian ..................... | B81B 3/0021 |
| 11,075,614 | B2 * | 7/2021 | Tsutsumi ........... | H03H 9/02118 |
| 11,222,849 | B2 * | 1/2022 | Huang ................... | H01L 24/82 |
| 11,245,383 | B2 * | 2/2022 | Hurwitz ................ | H01L 23/66 |
| 11,329,098 | B2 * | 5/2022 | Qian ..................... | B81B 3/0086 |
| 11,405,013 | B2 * | 8/2022 | Shin ................... | H03H 9/02015 |
| 11,418,169 | B2 * | 8/2022 | Houlden .............. | H03H 9/542 |
| 11,456,721 | B2 * | 9/2022 | Eid ....................... | H03H 9/542 |
| 11,463,063 | B2 * | 10/2022 | Hurwitz ................ | H03H 9/174 |
| 11,502,124 | B2 * | 11/2022 | Then ................... | H01L 29/2003 |
| 11,646,710 | B2 * | 5/2023 | Kim ......................... | H03H 3/02 |
| | | | | 29/25.35 |
| 11,870,410 | B2 * | 1/2024 | Luo ......................... | H03H 9/174 |
| 2006/0006965 | A1 * | 1/2006 | Ishii ....................... | H03H 9/564 |
| | | | | 333/191 |
| 2013/0113577 | A1 * | 5/2013 | Adkisson .............. | H03H 9/171 |
| | | | | 29/25.35 |
| 2017/0264263 | A1 | 9/2017 | Huang et al. | |
| 2018/0151622 | A1 * | 5/2018 | Soundara Pandian ... | H03H 9/25 |
| 2020/0212872 | A1 | 7/2020 | Haroun et al. | |
| 2021/0193903 | A1 * | 6/2021 | Shi ..................... | G06V 40/1306 |
| 2022/0077231 | A1 * | 3/2022 | Qin ........................ | H10N 39/00 |

FOREIGN PATENT DOCUMENTS

| | | |
|---|---|---|
| CN | 107181472 | 9/2017 |
| CN | 108880502 | 11/2018 |

OTHER PUBLICATIONS

"Notice of allowance of China Counterpart Application", issued on Jun. 30, 2025, p. 1-p. 6.

Po-Hsun Sung et al., "The Method for Integrating FBAR with Circuitry on CMOS Chip", Proceedings of the 2004 IEEE International Frequency Control Symposium and Exposition, Apr. 18, 2005.

Wang et al., "Design of Piezoelectric Elements' Protection Measures and Energy Output of Intelligent Power Pavement" China Journal of Highway and Transport, vol. 29, No. 5, May 2016.

* cited by examiner

204b

204a

204

202

200

50

STRUCTURE OF SEMICONDUCTOR DEVICE AND METHOD FOR FABRICATING THE SAME

CROSS-REFERENCE TO RELATED APPLICATION

This application claims the priority benefit of China application serial no. 202011545152.1, filed on Dec. 24, 2020. The entirety of the above-mentioned patent application is hereby incorporated by reference herein and made a part of this specification.

BACKGROUND

1. Technical Field

The disclosure relates to a semiconductor fabricating technology, and particularly to a structure of a semiconductor device and a method for fabricating the same.

2. Description of Related Art

Surface acoustic wave (SAW) is an acoustic wave propagating along the surface of an elastic material, and its amplitude typically decays exponentially with the depth into the material.

An SAW device is used in a circuit member to provide a variety of different functions, for example, including a delay line, a filter, a correlator, and a DC-DC converter. Based on the lightweight and dense structure, the SAW device is also used in a cellular phone.

With the application of a higher frequency circuit, for example, when a cellular phone is under a 5G high frequency operation, the device of an SAW filter is changed to a bulk acoustic wave (BAW) filter suitable for higher frequency operation. For the overall integrated circuit, a BAW filter is integrated with a circuit substrate in fabrication. The circuit substrate includes, for example, an operating circuit generally based on a silicon device and a high frequency operating circuit based on a GaN device.

The fabricating technology of effectively integrating a BAW filter with a circuit substrate is still under development.

SUMMARY

The disclosure provides a structure in which a bulk acoustic wave (BAW) filter is integrated with a circuit substrate and a method for fabricating the same, which can effectively combine the BAW filter and its application circuit.

In an embodiment, the disclosure provides a structure of a semiconductor device, including a circuit substrate. A first metal layer is disposed on the circuit substrate. A buffer layer is disposed on the first metal layer. An absorbing layer is disposed on the buffer layer. A first electrode layer is disposed on the absorbing layer. A plurality of piezoelectric material units are disposed on the first electrode layer. A protection layer is conformally disposed on the plurality of piezoelectric material units. A second metal layer is disposed over the plurality of piezoelectric material units, including a first part and a second part. The first part penetrating through the protection layer is disposed on the plurality of piezoelectric material units, serving as a second electrode layer. The second part is at a same level of the first part and at least electrically connects to the first electrode layer.

In an embodiment, for the structure of the semiconductor device, an interlayer dielectric layer is further included to support the second metal layer, and the protection layer is harder than the interlayer dielectric layer.

In an embodiment, for the structure of the semiconductor device, the absorbing layer is a laminated structure.

In an embodiment, for the structure of the semiconductor device, the absorbing layer includes a plurality of embedded air-gap regions corresponding to the plurality of piezoelectric material units.

In an embodiment, for the structure of the semiconductor device, the first electrode layer has a connection part extending beyond the plurality of piezoelectric material units, and a via connects between the connection part and the second part of the second metal layer.

In an embodiment, for the structure of the semiconductor device, the second metal layer further includes a third part electrically connecting to the first metal layer through a via structure.

In an embodiment, for the structure of the semiconductor device, the first metal layer also electrically connects to the circuit routing structure of the circuit substrate.

In an embodiment, for the structure of the semiconductor device, the circuit substrate includes a first device circuit layer and a second device circuit layer over the first device circuit layer.

In an embodiment, for the structure of the semiconductor device, the first device circuit layer includes a silicon device, and the second device circuit layer includes a GaN device.

In an embodiment, for the structure of the semiconductor device, the first device circuit layer of the circuit substrate includes a thermal detecting device.

In an embodiment, for the structure of the semiconductor device, the first electrode layer under the plurality of piezoelectric material units is surrounded by an interlayer dielectric layer on the absorbing layer.

In an embodiment, the disclosure further provides a method for fabricating a semiconductor device, including providing a circuit substrate. A first metal layer is formed on the circuit substrate. A buffer layer is formed on the first metal layer and an absorbing layer is formed on the buffer layer. A first electrode layer is formed on the absorbing layer. A plurality of piezoelectric material units are formed on the first electrode layer. A protection layer is conformally disposed on the plurality of piezoelectric material units. A second metal layer is formed over the plurality of piezoelectric material units. The second metal layer includes a first part and a second part. The first part is disposed on the plurality of piezoelectric material units through the protection layer, serving as a second electrode layer. The second part is at a same level of the first part, and at least electrically connects to the first electrode layer.

In an embodiment, for the method for fabricating the semiconductor device, an interlayer dielectric layer is further formed to support the second metal layer, and the protection layer is harder than the interlayer dielectric layer.

In an embodiment, for the method for fabricating the semiconductor device, the step of forming the absorbing layer is to form a laminated structure by alternately stacking a plurality of layers of two different materials.

In an embodiment, for the method for fabricating the semiconductor device, the step of forming the absorbing layer includes: forming a dielectric layer with a sacrificial material layer embedded in the dielectric layer, removing the sacrificial material layer to form a plurality of air-gap regions after forming the protection layer on the plurality of piezoelectric material units, and the plurality of air-gap regions correspond to the plurality of piezoelectric material units.

In an embodiment, for the method for fabricating the semiconductor device, the first electrode layer has a connection part extending beyond of the plurality of piezoelectric material units, and a via connects between the connection part and the second part of the second metal layer.

In an embodiment, for the method for fabricating the semiconductor device, the second metal layer as formed further includes a third part electrically connecting to the first metal layer through a via structure.

In an embodiment, for the method for fabricating the semiconductor device, the first metal layer as formed also electrically connects to the circuit routing structure of the circuit substrate.

In an embodiment, for the method for fabricating the semiconductor device, the formed circuit substrate includes a first device circuit layer and a second device circuit layer over the first device circuit layer.

In an embodiment, for the method for fabricating the semiconductor device, the first device circuit layer includes a silicon device, and the second device circuit layer includes a GaN device.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
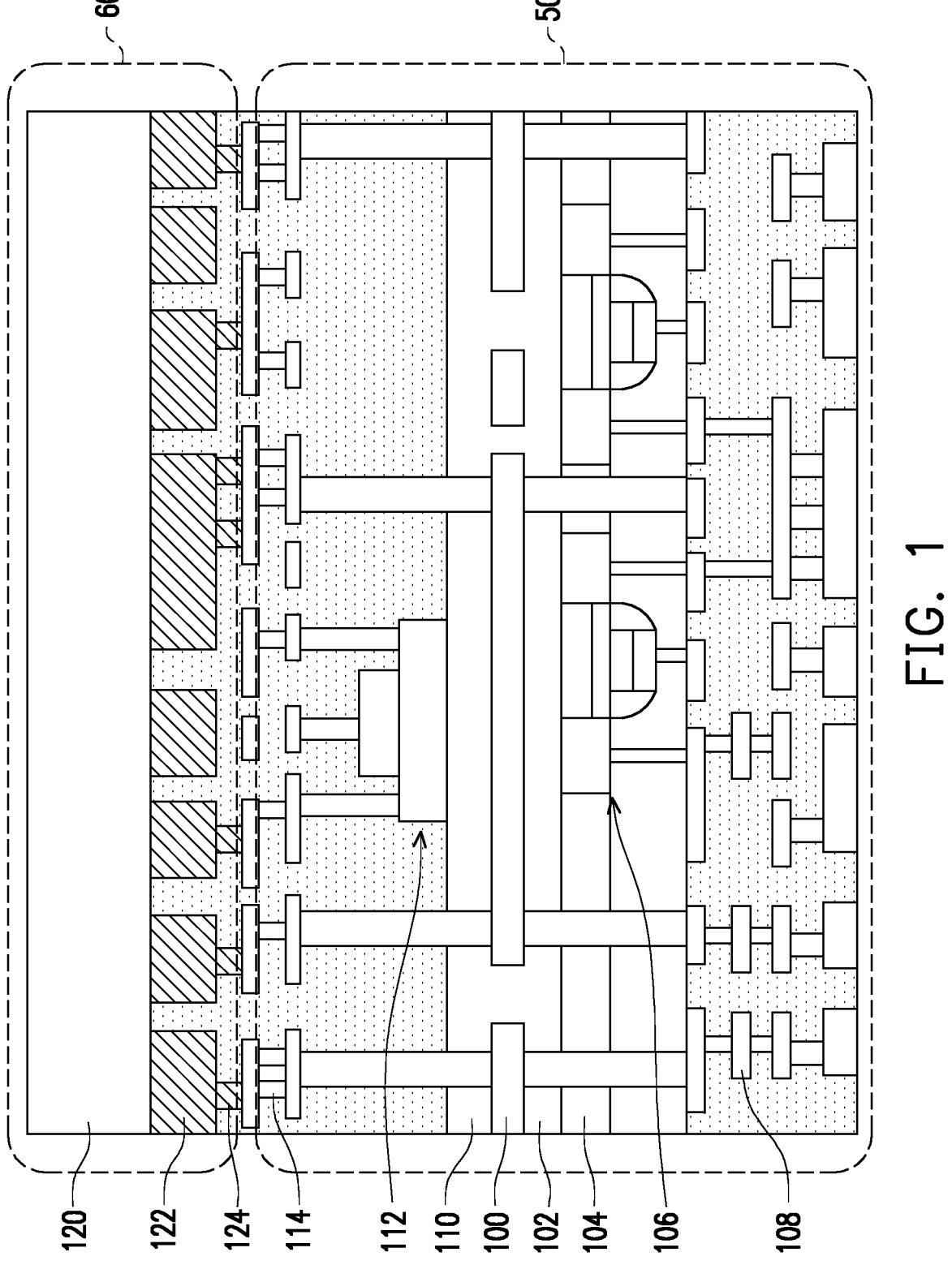
FIG. 1 is a schematic diagram of a cross-sectional structure of a semiconductor device integrated with a BAW filter according to an embodiment.

Reference will now be made in detail to the exemplary embodiments of the disclosure, examples of which are illustrated in the accompanying drawings. Wherever possible, the same reference numbers are used in the drawings and the description to refer to the same or like parts.

The disclosure relates to a structure of a semiconductor device including a bulk acoustic wave (BAW) filter and a method for fabricating the same. The acoustic wave filter is, for example, a BAW filter, which can be fabricated on a circuit substrate according to the semiconductor fabricating technology and obtain sufficient protection.

A number of embodiments are provided below to illustrate the disclosure, but the disclosure is not limited to the cited embodiments, and the embodiments might be combined with each other as appropriate.

FIG. 1 is a schematic diagram of a cross-sectional structure of a semiconductor device integrated with a BAW filter according to an embodiment. Referring to FIG. 1, in semiconductor fabricating technology, an integrated circuit of an electronic device includes a variety of operating circuits, the operating circuits complete fabricating a circuit substrate 50 according to the semiconductor fabricating technology, and the circuit substrate 50 includes a silicon device 106 and a GaN device 112 suitable for high-frequency operation. The circuit of the circuit substrate 50 is, for example, a basic circuit of a cellular phone, and for example, to meet the needs of wireless communication, a BAW acoustic wave filter circuit 60 continues to be formed on the circuit substrate 50 to achieve the overall circuit.

The basic structure of the circuit substrate 50 includes a buffer layer 102 and a buffer layer 110 in the middle, a circuit including the silicon device 106 and a circuit including the GaN device 112 formed on both sides. There may also be a shielding metal layer 100 between the buffer layer 102 and the buffer layer 110 to shield the two circuits. The silicon device 106 is, for example, a device fabricated based on a silicon layer 104, such as a silicon transistor. The GaN device 112 is, for example, a GaN transistor suitable for high frequency operation, and for example, can be used in a wireless communication circuit. In addition, an interconnection structure 108 and an interconnection structure 114 on both sides provide a required interconnection routing. In a general manner, the interconnection structure 108 and the interconnection structure 114 include a horizontally extending metal layer and a vertically connected via structure to achieve the required interconnection routing. In addition, based on the semiconductor fabricating process, an interlayer dielectric layer is involved, so as to achieve the fabrication and support of the metal device structure.

The structure of the circuit substrate 50 of FIG. 1 is only an embodiment, and the disclosure is not limited to the cited embodiment. The actual integrated circuit of the circuit substrate 50 is determined according to actual needs and not limited to a specific structure. The structure of the circuit substrate 50 is not limited to the cited embodiment.

After the fabrication of the circuit substrate 50 is completed, the acoustic wave filter circuit 60 can continue to be fabricated into a complete integrated circuit. The acoustic wave filter circuit 60 includes, for example, a BAW filter layer 120 and a required metal layer 122 electrically connecting to the circuit substrate 50 through a via 124. The thickness of the metal layer 122 is relatively large, for example, the metal layer 122 can simultaneously serve as the functions of signal receiving, shielding, thermal dissipating and the like. The acoustic wave filter circuit 60 is, for example, a passive device, which is beneficial to subsequent applications of other functional circuits.

The disclosure provides a fabricating process of the acoustic wave filter circuit 60 based on the circuit substrate 50. FIG. 2 to FIG. 5 are schematic cross-sectional diagrams of a fabrication procedure for fabricating a semiconductor device including a BAW filter unit according to an embodiment.

Figure 2:
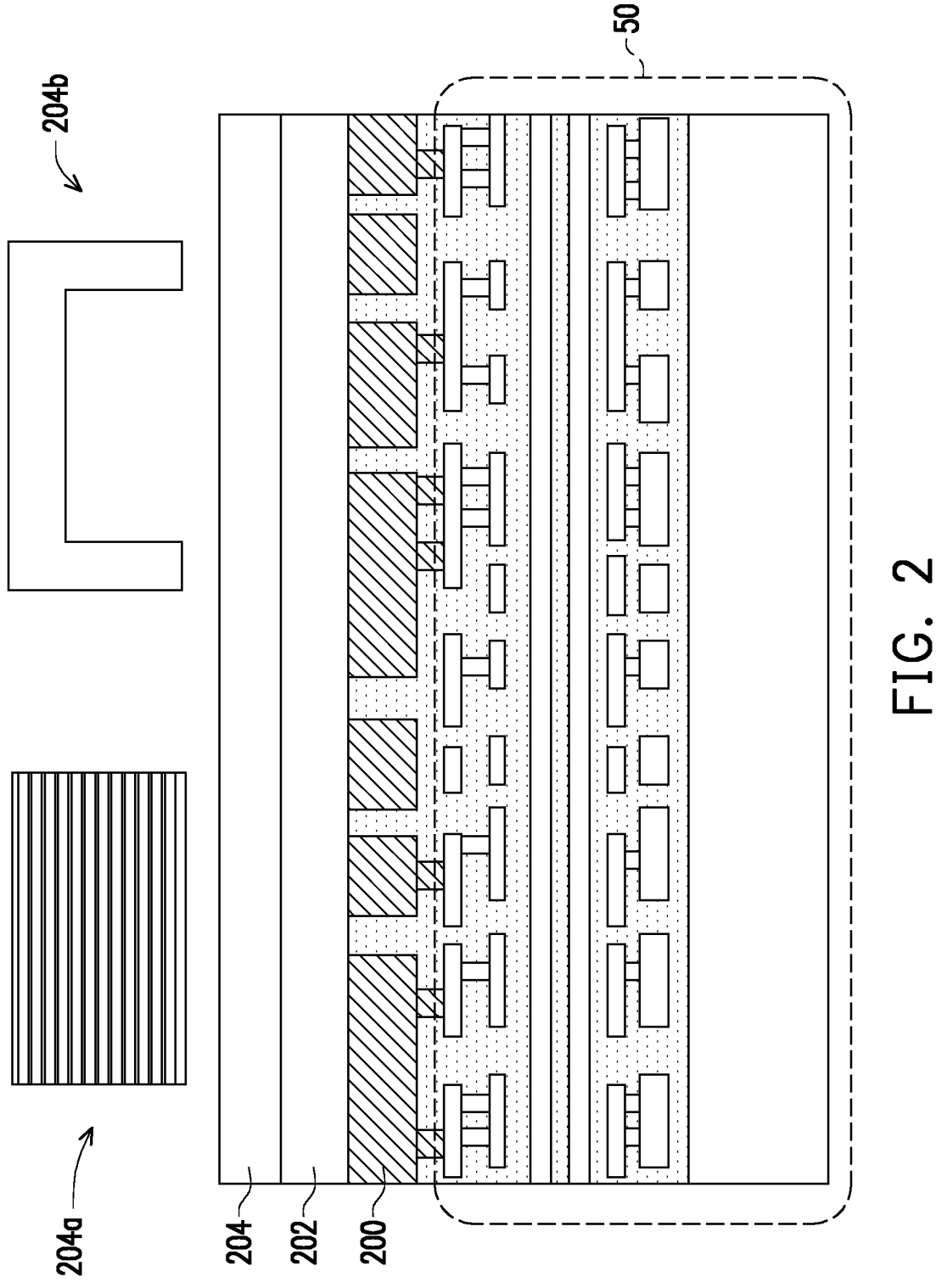
FIG. 2 to FIG. 5 are schematic cross-sectional diagrams of a fabrication procedure for fabricating a semiconductor device including a BAW filter according to an embodiment.

Referring to FIG. 2, for example, a metal layer 200 is formed on the circuit substrate 50 first, and then the metal layer 200 and the circuit substrate 50, for example, electrically connects to the interconnection structure 114 of the circuit substrate 50 through a via. The thickness of the metal layer 200 is relatively large, and the metal layer 200 can also provide electrical shielding and thermal dissipating functions at the same time in addition to providing the circuit routing required for electrical connection. The metal layer 200 also provides mechanical support strength, which is beneficial to the subsequent formation of the acoustic wave filter. Next, a buffer layer 202 (for example, an oxide layer) is formed on the metal layer 200 to serves as a structural base to be formed later and also provides a flat processing plane.

An absorbing layer 204 is formed on the buffer layer 202. Due to the BAW filter unit having the effect of pressure, the absorbing layer 204 can absorb mechanical stress. In an embodiment, the absorbing layer 204 is a laminated structure 204a formed by alternately stacking a plurality of layers of two different materials. In an embodiment, the absorbing layer 204 may also be a plurality of air-gap structures 204b corresponding to the filter units to be formed later. The laminated structure 204a or the air-gap structures 204b of FIG. 2 is an embodiment to illustrate the detailed structure of the absorbing layer 204.

Figure 3:
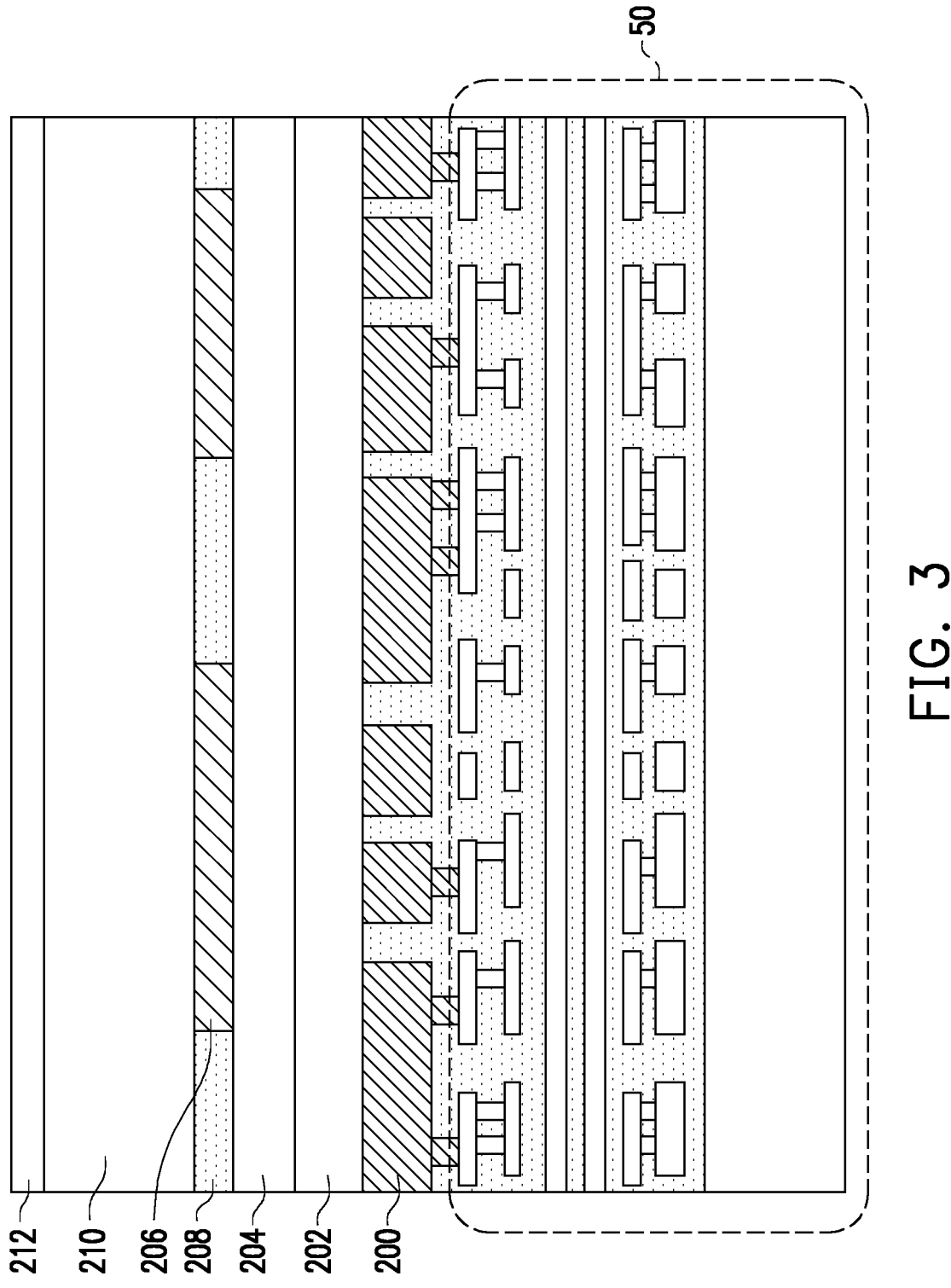

Referring to FIG. 3, an electrode layer 206 which is intended to be the lower electrode of the filter units is formed on the absorbing layer 204. The electrode layer 206 is formed by cooperating with a patterning process to form an interlayer dielectric layer 208, thereafter, for example, through a deposition and grinding process, a metal material is filled into the pattern of the interlayer dielectric layer 208, and the electrode layer 206 is completed.

A piezoelectric material layer 210 is formed on the electrode layer 206 and the interlayer dielectric layer 208. The piezoelectric material layer 210 is an initial material layer for the BAW filter units to be formed later. The piezoelectric material layer 210 has a predetermined thickness to achieve a BAW filtering effect. Since the piezoelectric material layer 210 needs to be patterned to obtain a plurality of filter units, the patterning process involves an etching process. A protection layer 212 may also be formed on the piezoelectric material layer 210 and provides protection in the subsequent etching process.

Figure 4:
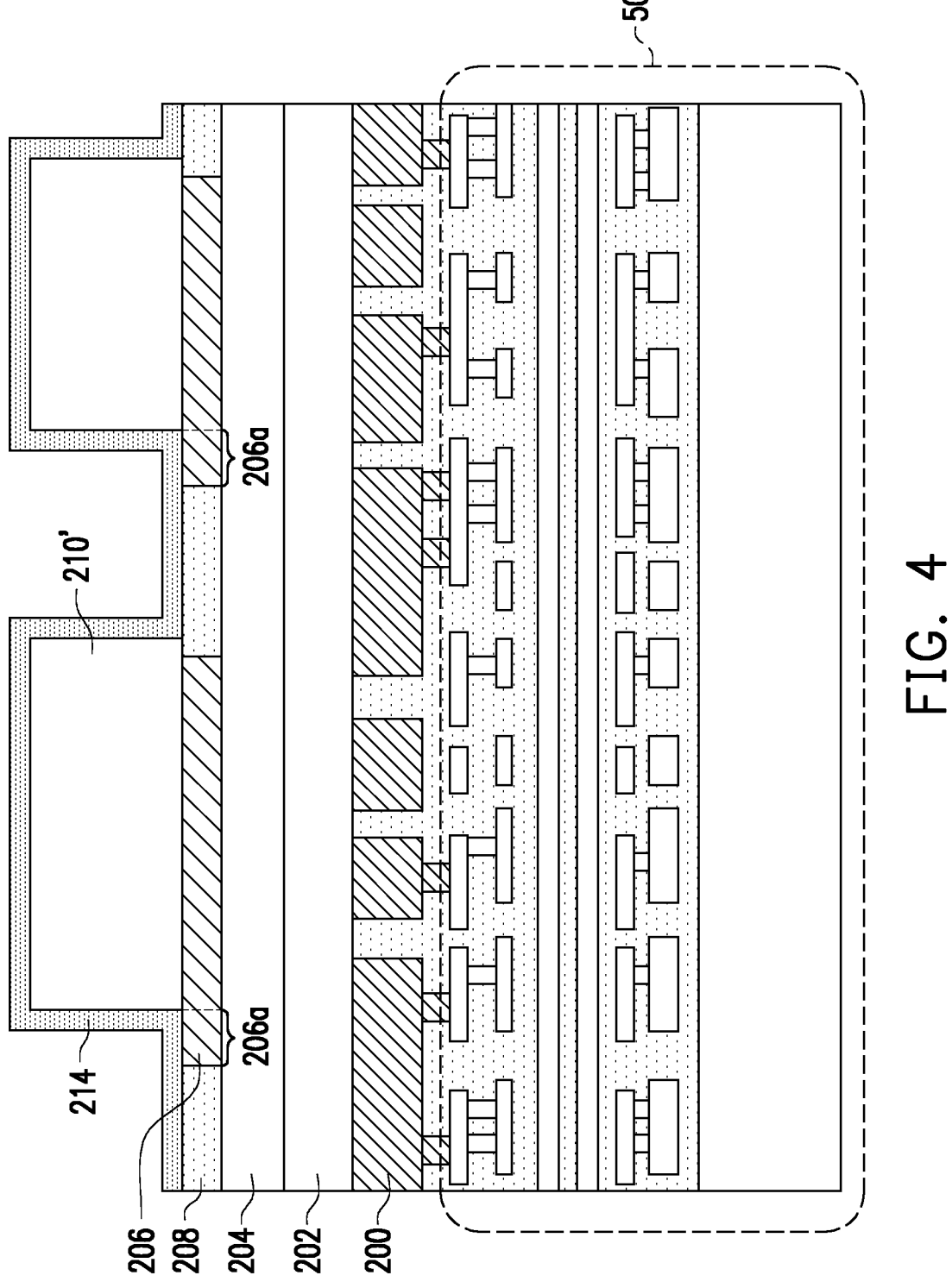

Referring to FIG. 4, a patterning process is applied on the piezoelectric material layer 210 to form a plurality of piezoelectric material units 210'. The functions of the piezoelectric material units 210' constitute a BAW filter. A protection layer 214 is conformally formed on the plurality of piezoelectric material units 210' formed by the piezoelectric material layer 210. The protection layer 214 is a relatively hard material and at least protects the sidewall of the piezoelectric material units 210'. The protection layer 212 pre-formed on the top surface of the piezoelectric material unit 210' can be removed first, or retained to be combined with the protection layer 214. In addition, the electrode layer 206 has an extension area 206a extending beyond the piezoelectric material units formed by the piezoelectric material layer 210. The extension area 206a as described later, for example, vertically upward connects to other back-end application circuits from the electrode layer 206 by passing through a conductive via.

Figure 5:
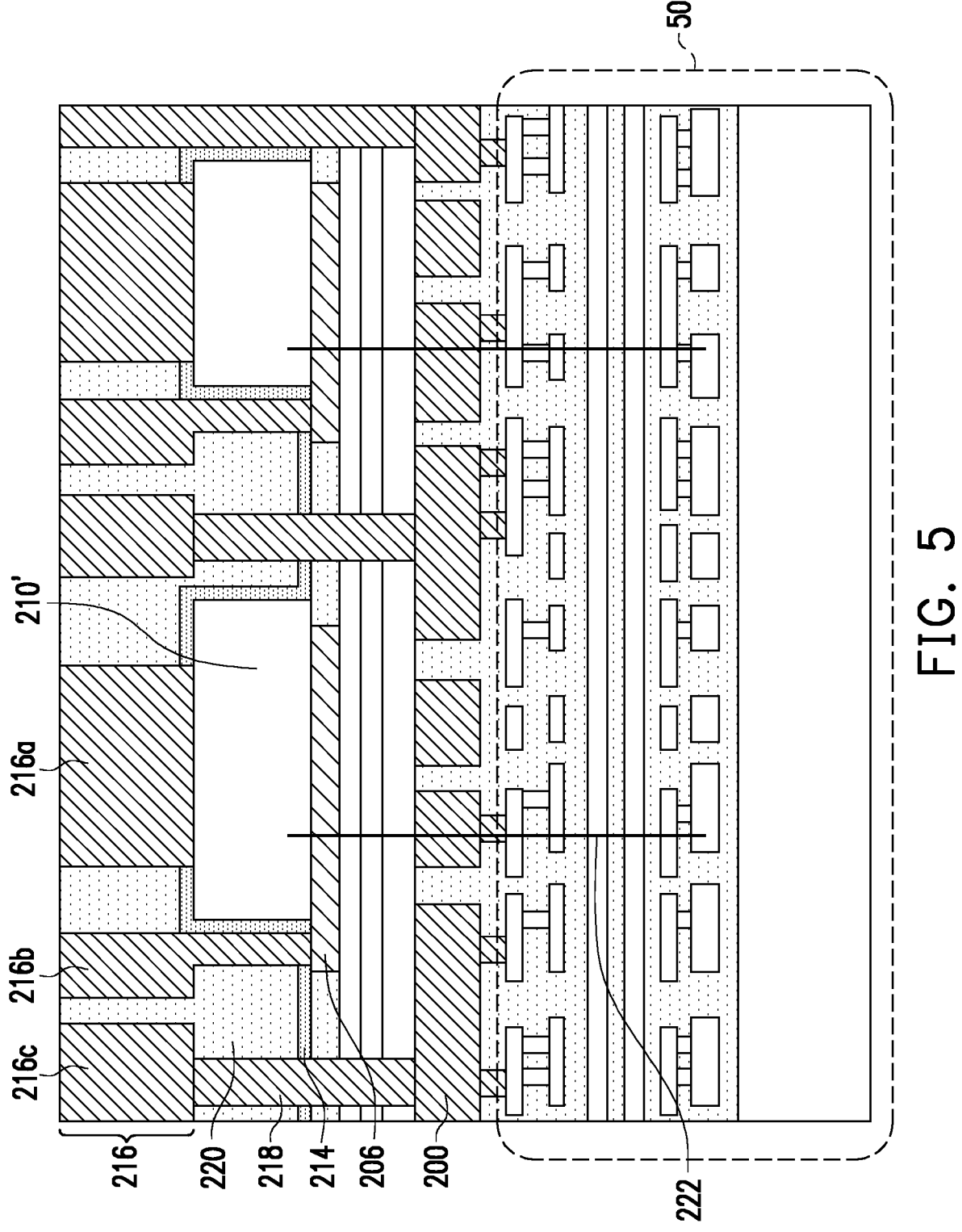

Referring to FIG. 5, a plurality of vias 218 are formed using the patterned interlayer dielectric layer 220 structure. The vias 218 contacts and connects to their corresponding different members, for example, contacting and connecting to the electrode layer 206 or the metal layer 200 to provide electrical connection in a vertical direction. Next, a metal layer 216 is formed over the plurality of piezoelectric material units 210', and includes, for example, a part 216a penetrating through the protection layer 214 and disposed on the plurality of piezoelectric material units 210' of the piezoelectric material layer 210 and serve as the second electrode layer. The metal layer 216 also includes another part 216b at the same level of the part 216a mentioned above and at least electrically connecting to the electrode layer 206. The metal layer 216 may also include a part 216c contacting and connecting to the metal layer 200 through the via 218.

For the temperature control of the piezoelectric material units 210', according to actual needs, the circuit substrate 50 can also be provided with a thermal detecting device and a thermal compensation device which also detect and compensate for the piezoelectric material units 210' through a path 222. Here, the path 222 is just schematically drawn, and the actually formed path 222 can be a serpentine path, the disclosure is not limited thereto.

The absorbing layer 204 described in FIG. 2 is, for example, formed as the laminated structure 204a. In an embodiment, the absorbing layer 204 can also be a structure including the plurality of air-gap structures 204b.

Figure 6:
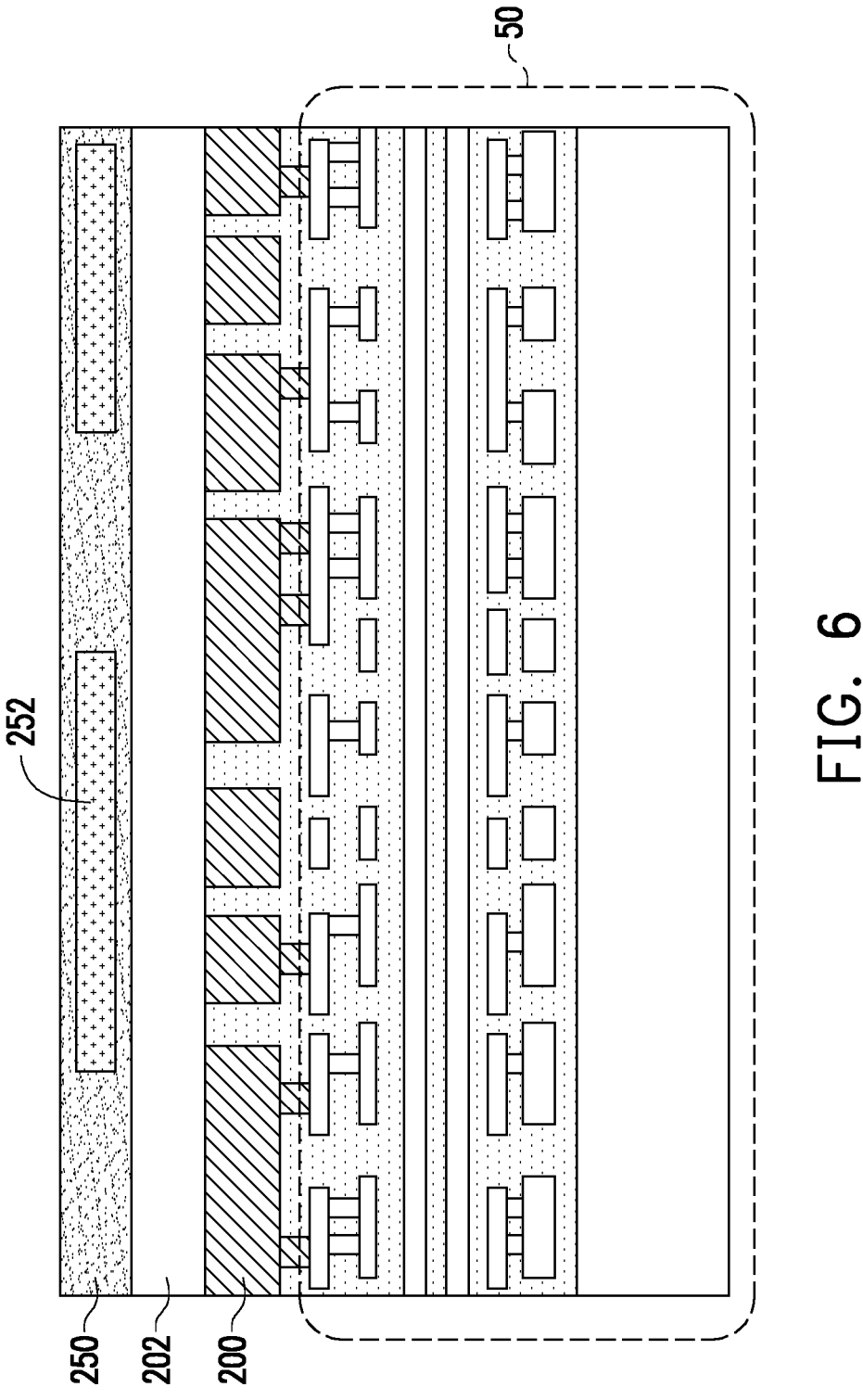
FIG. 6 to FIG. 8 are schematic cross-sectional diagrams of a fabrication procedure for fabricating a semiconductor device including a BAW filter according to an embodiment.
Figure 7:
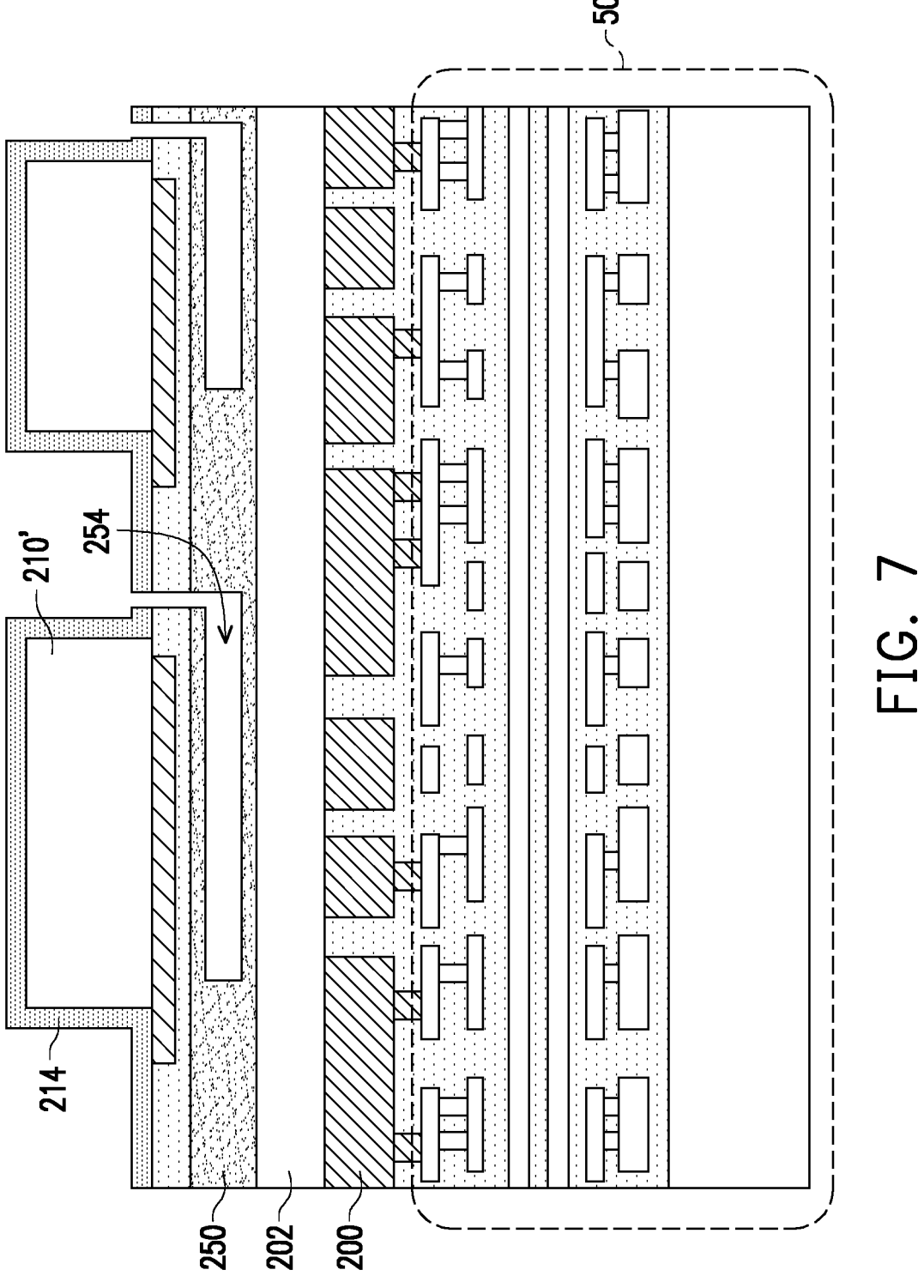
Figure 8:
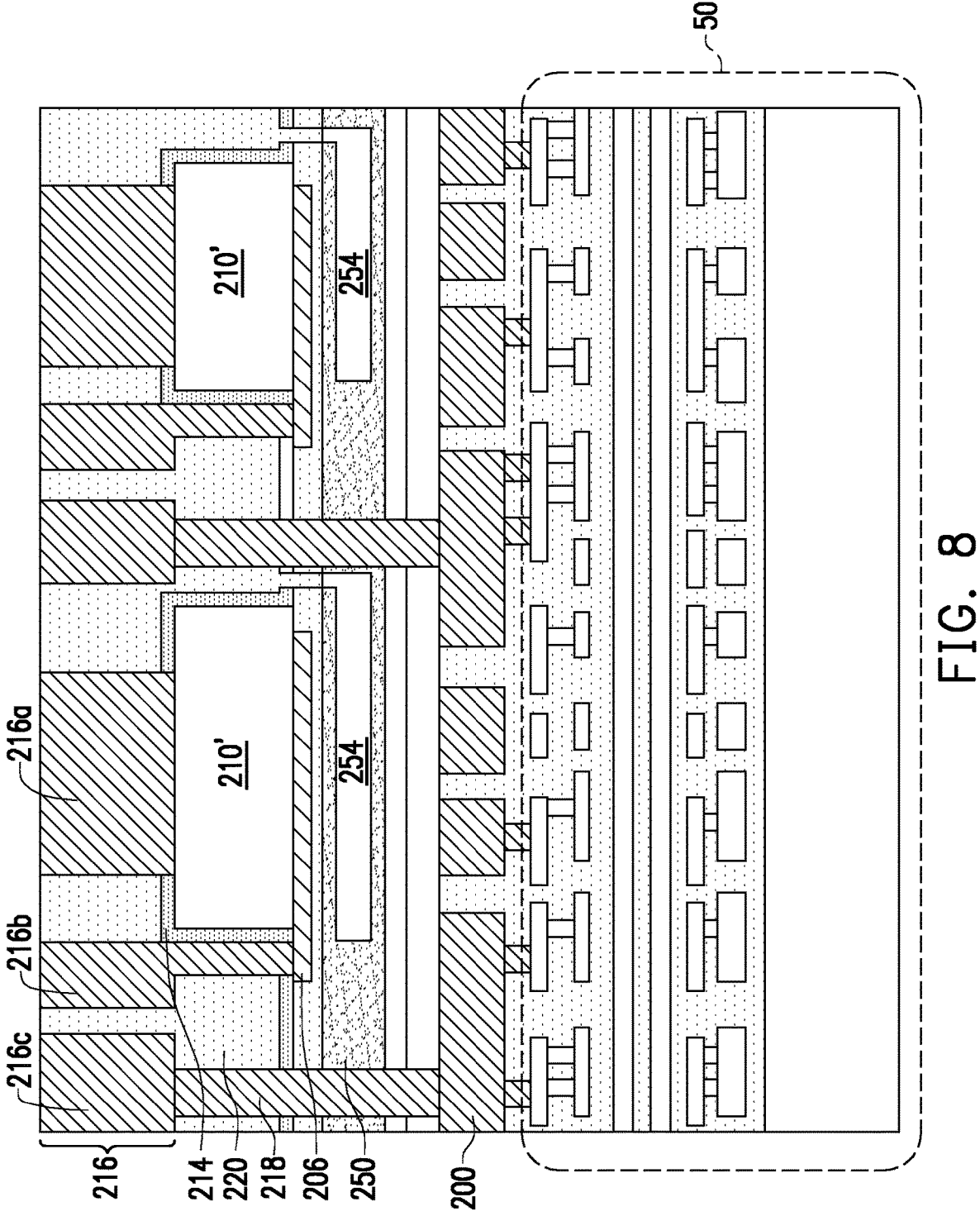

FIG. 6 to FIG. 8 are schematic cross-sectional diagrams of a fabrication procedure for fabricating a semiconductor device including a BAW filter according to an embodiment. Referring to FIG. 6, if the absorbing layer 204 is to form the air-gap structures 204b, it forms a dielectric layer 250, for example. An embedded sacrificial layer 252 is also formed in a predetermined region in the dielectric layer 250. The materials of the dielectric layer 250 and the sacrificial layer 252 are different, so that the sacrificial layer 252 can be removed by using the etching process in a later phase of the fabrication procedure to form the air-gap structures.

Referring to FIG. 7, as the fabrication in FIG. 3 and FIG. 4, the protection layer 214 is formed on the piezoelectric material unit 210'. Here, the position of the piezoelectric material unit 210' corresponds to the position of the sacrificial layer 252, thereby absorbing the pressure on the piezoelectric material unit 210'. After the protection layer 214 is formed on the piezoelectric material unit 210', a small opening may be formed on the side of the piezoelectric material unit 210', so that the sacrificial layer 252 can be removed through the etching process, for example, and an air-gap 254 is obtained.

Referring to FIG. 8, according to the fabricating process of FIG. 5, after the subsequent formation of the metal layer 216 is completed, the interlayer dielectric layer 220 seals the air-gap 254. In this way, the absorbing layer 250 is a structure including the air-gap 254.

The fabrication procedure of the disclosure integrates the BAW filter on the circuit substrate 50 by, for example, directly forming the flat plane provided by the buffer layer 202 on the circuit substrate 50. The BAW filter can be fabricated on the circuit substrate 50 by cooperating with the large-thickness metal layer and the protection layer for the filter unit.

Finally, it should be noted that the above embodiments are only used to illustrate the technical solutions of the disclosure and are not intended to limit it. Although the disclosure has been described in detail with reference to the above embodiments, persons of ordinary skill in the art should understand that they may still modify the technical solutions described in the above embodiments, or replace some or all of the technical features therein with equivalents, and that such modifications or replacements of corresponding technical solutions do not substantially deviate from the scope of the technical solutions of the embodiments of the disclosure.

What is claimed is:

1. A structure of a semiconductor device, comprising:
   a circuit substrate;
   a first metal layer, disposed on the circuit substrate;
   a buffer layer, disposed on the first metal layer;
   an absorbing layer, disposed on the buffer layer;
   a first electrode layer, disposed on the absorbing layer;
   a piezoelectric material unit, disposed on the first electrode layer;

a protection layer, covering an entirety of a sidewall of the piezoelectric material unit directly connected to a topmost surface and a bottommost surface of the piezoelectric material unit; and a second metal layer, disposed over the piezoelectric material unit, comprising:

a first part, disposed on the piezoelectric material unit through the protection layer, serving as a second electrode layer; and a second part, at a same level of the first part, and at least electrically connecting to the first electrode layer, wherein the absorbing layer comprises an embedded air-gap region surrounded by a dielectric layer and corresponding to the piezoelectric material unit, and the dielectric layer is disposed between the embedded air-gap region and the first electrode layer.

2. The structure of the semiconductor device according to claim 1, further comprising an interlayer dielectric layer to support the second metal layer, wherein the protection layer is harder than the interlayer dielectric layer.

3. The structure of the semiconductor device according to claim 1, wherein the first electrode layer has a connection part extending beyond the piezoelectric material unit, and a via connects between the connection part and the second part of the second metal layer.

4. The structure of the semiconductor device according to claim 1, wherein the second metal layer further comprises a third part electrically connecting to the first metal layer through a via structure.

5. The structure of the semiconductor device according to claim 4, wherein the first metal layer also electrically connects to a circuit routing structure of the circuit substrate.

6. The structure of the semiconductor device according to claim 1, wherein the circuit substrate comprises a first device circuit layer and a second device circuit layer over the first device circuit layer.

7. The structure of the semiconductor device according to claim 6, wherein the first device circuit layer comprises a silicon device, and the second device circuit layer comprises a GaN device.

8. The structure of the semiconductor device according to claim 7, wherein the first device circuit layer of the circuit substrate comprises a thermal detecting device.

9. The structure of the semiconductor device according to claim 1, wherein the first electrode layer under the piezoelectric material unit is surrounded by an interlayer dielectric layer on the absorbing layer.

10. A method for fabricating a semiconductor device, comprising:

providing a circuit substrate;

forming a first metal layer on the circuit substrate;

forming a buffer layer on the first metal layer;

forming an absorbing layer on the buffer layer;

forming a first electrode layer on the absorbing layer;

forming a piezoelectric material unit on the first electrode layer;

forming a protection layer, covering an entirety of a sidewall of the piezoelectric material unit directly connected to a topmost surface and a bottommost surface of the piezoelectric material unit; and forming a second metal layer over the piezoelectric material unit, the second metal layer comprising:

a first part, disposed on the piezoelectric material unit through the protection layer, serving as a second electrode layer; and a second part, at a same level of the first part, and at least electrically connecting to the first electrode layer, wherein the step of forming the absorbing layer comprises:

forming a dielectric layer containing a sacrificial material layer embedded in the dielectric layer; and removing the sacrificial material layer after forming the protection layer on the piezoelectric material unit to form an air-gap region surrounded by the dielectric layer, wherein the air-gap region corresponds to the piezoelectric material unit, and the dielectric layer is disposed between the air-gap region and the first electrode layer.

11. The method for fabricating the semiconductor device according to claim 10, further comprising forming an interlayer dielectric layer to support the second metal layer, wherein the protection layer is harder than the interlayer dielectric layer.

12. The method for fabricating the semiconductor device according to claim 10, wherein the first electrode layer has a connection part extending beyond the piezoelectric material unit, and a via is connecting between the connection part and the second part of the second metal layer.

13. The method for fabricating the semiconductor device according to claim 10, wherein the second metal layer as formed further comprises a third part electrically connecting to the first metal layer through a via structure.

14. The method for fabricating the semiconductor device according to claim 13, wherein the first metal layer also electrically connects to a circuit routing structure of the circuit substrate.

15. The method for fabricating the semiconductor device according to claim 10, wherein the circuit substrate as provided comprises a first device circuit layer and a second device circuit layer over the first device circuit layer.

16. The method for fabricating the semiconductor device according to claim 15, wherein the first device circuit layer comprises a silicon device, and the second device circuit layer comprises a GaN device.

* * * * *